United States Patent
Takizawa et al.

(10) Patent No.: US 9,728,268 B1
(45) Date of Patent: Aug. 8, 2017

(54) MEMORY DEVICE

(71) Applicant: Kabushiki Kaisha Toshiba, Minato-ku (JP)

(72) Inventors: Kazutaka Takizawa, Yokohama (JP); Masaaki Niijima, Machida (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/264,075

(22) Filed: Sep. 13, 2016

Related U.S. Application Data

(60) Provisional application No. 62/313,319, filed on Mar. 25, 2016.

(51) Int. Cl.
G11C 11/34  (2006.01)
G11C 16/34  (2006.01)
G11C 8/10   (2006.01)
G11C 16/16  (2006.01)

(52) U.S. Cl.
CPC ............ *G11C 16/3445* (2013.01); *G11C 8/10* (2013.01); *G11C 16/16* (2013.01); *G11C 16/345* (2013.01)

(58) Field of Classification Search
CPC ....... G11C 16/3445; G11C 16/16; G11C 8/10; G11C 16/345; G11C 8/08
USPC .................................................. 365/185.22
See application file for complete search history.

(56) References Cited

U.S. PATENT DOCUMENTS

| 7,532,520 | B2 | 5/2009 | Yanagidaira et al. | |
|---|---|---|---|---|
| 8,755,233 | B2 | 6/2014 | Nagashima | |
| 8,976,597 | B2 | 3/2015 | Shiino et al. | |
| 2007/0064326 | A1 | 3/2007 | Kanno | |
| 2008/0019182 | A1* | 1/2008 | Yanagidaira | G11C 8/08 365/185.19 |
| 2010/0034025 | A1 | 2/2010 | Yanagidaira et al. | |
| 2012/0022215 | A1 | 1/2012 | Yoshizawa et al. | |
| 2012/0206972 | A1* | 8/2012 | Shiino | G11C 16/16 365/185.19 |

FOREIGN PATENT DOCUMENTS

| JP | 2007-87464 | 4/2007 |
|---|---|---|
| JP | 2008-47273 | 2/2008 |
| JP | 2010-40144 | 2/2010 |
| JP | 2012-25821 | 2/2012 |
| JP | 2012-169020 | 9/2012 |
| JP | 2012-203692 | 10/2012 |
| JP | 5364750 | 12/2013 |
| JP | 5514135 | 6/2014 |

* cited by examiner

*Primary Examiner* — Richard Elms
*Assistant Examiner* — Xiaochun L Chen
(74) *Attorney, Agent, or Firm* — Oblon, McClelland, Maier & Neustadt, L.L.P.

(57) ABSTRACT

According to one embodiment, a memory device includes a controller, and a nonvolatile memory controlled by the controller, the nonvolatile memory executing an erase operation by an algorithm which repeats loops, each loop including an erase step applying an erase pulse to a memory cell and a verify step verifying a threshold voltage of the memory cell after the erase step, an erase-verify-read voltage using the verify step changing in a x-th loop (x is a natural number equal to or larger than 2). The controller is capable of changing a value of x, and indicates the value of x to the nonvolatile memory.

21 Claims, 11 Drawing Sheets

| $Q = \sum_{i=1}^{N}(\text{Verai} \times \text{ti})$ | Value of Vev |
|---|---|
| $Q \leqq \Sigma \text{th0}$<br>$(1 \leqq N \leqq x-1)$ | Vev1 |
| $\Sigma \text{th0} < Q \leqq \Sigma \text{th1}$<br>$(x \leqq N \leqq y-1)$ | Vev2 |
| $\Sigma \text{th1} < Q$<br>$(y \leqq N \leqq z)$ | Vev3 |

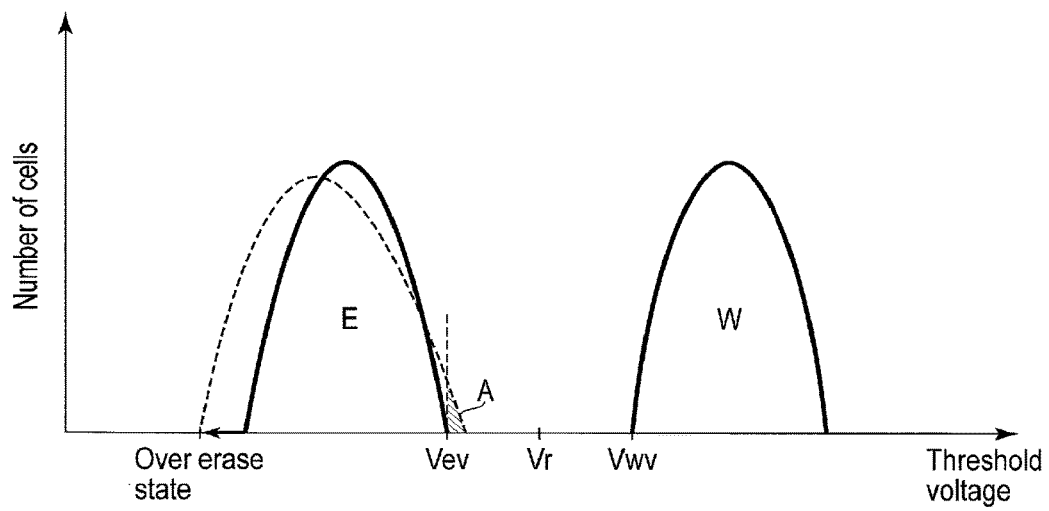
F I G. 5
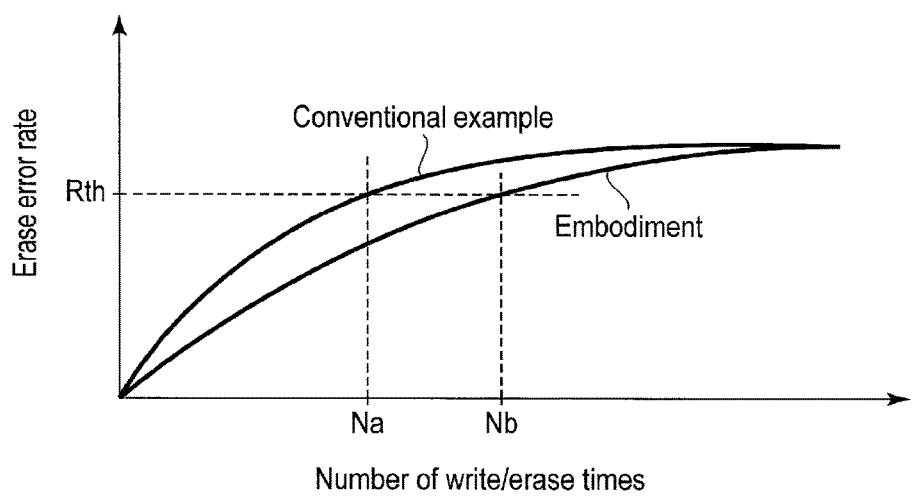
F I G. 6

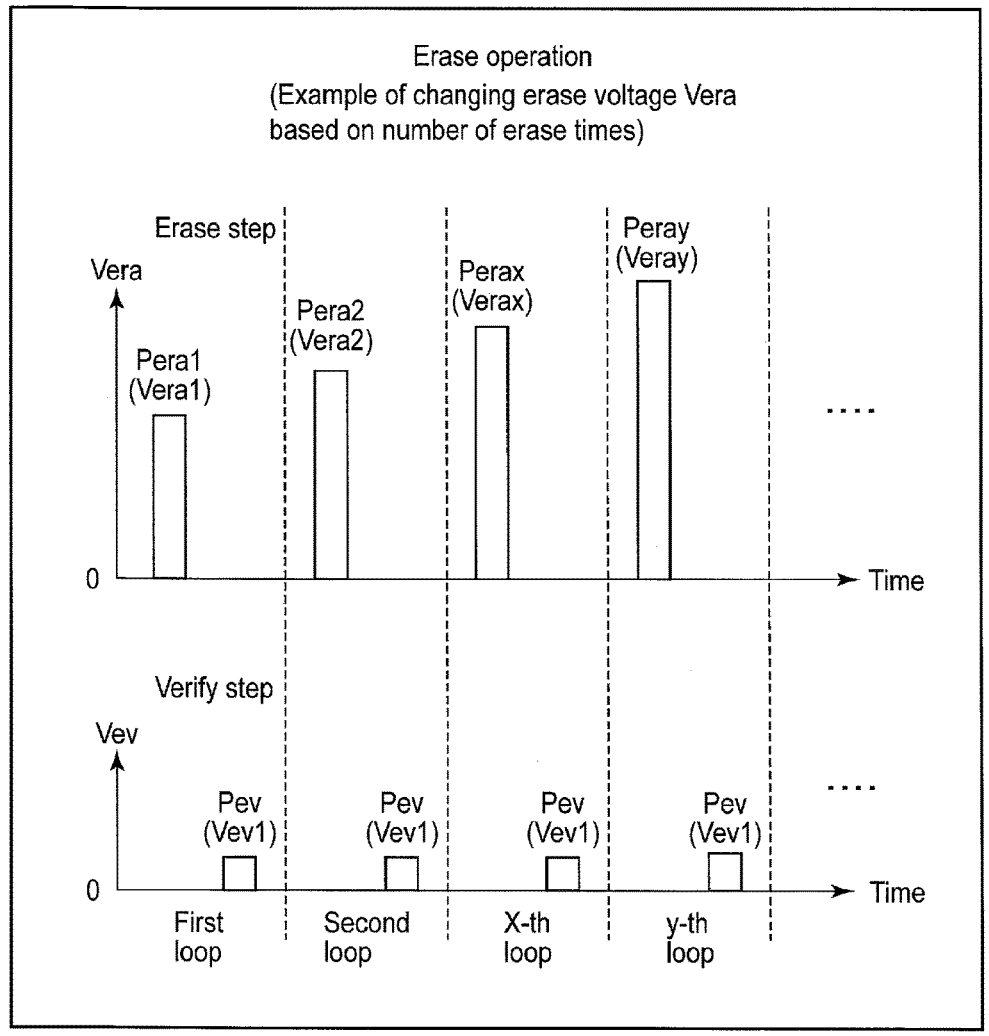
F I G. 7

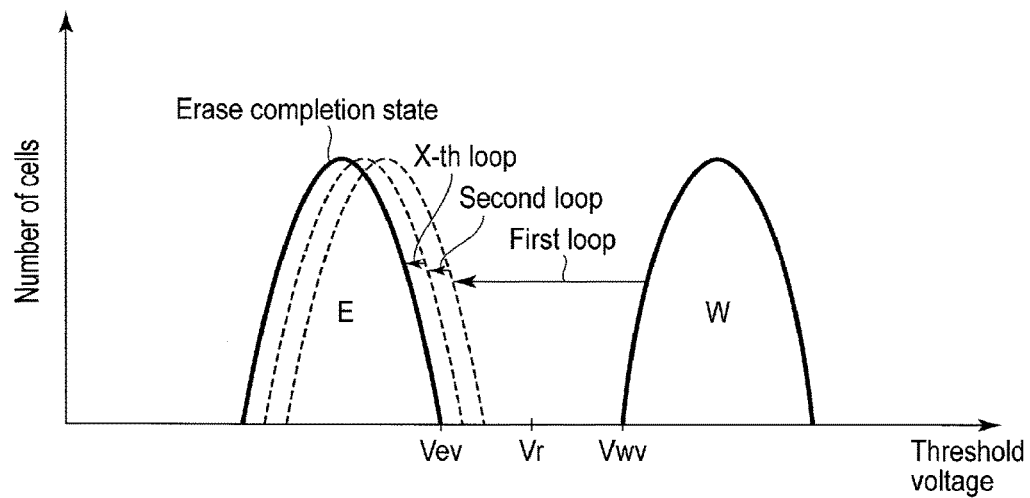
F I G. 8
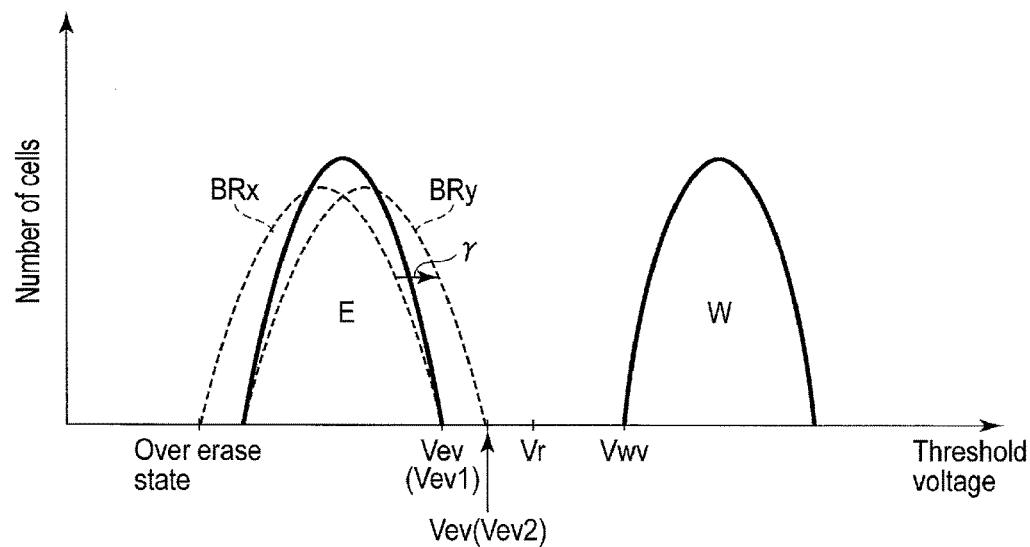
F I G. 9

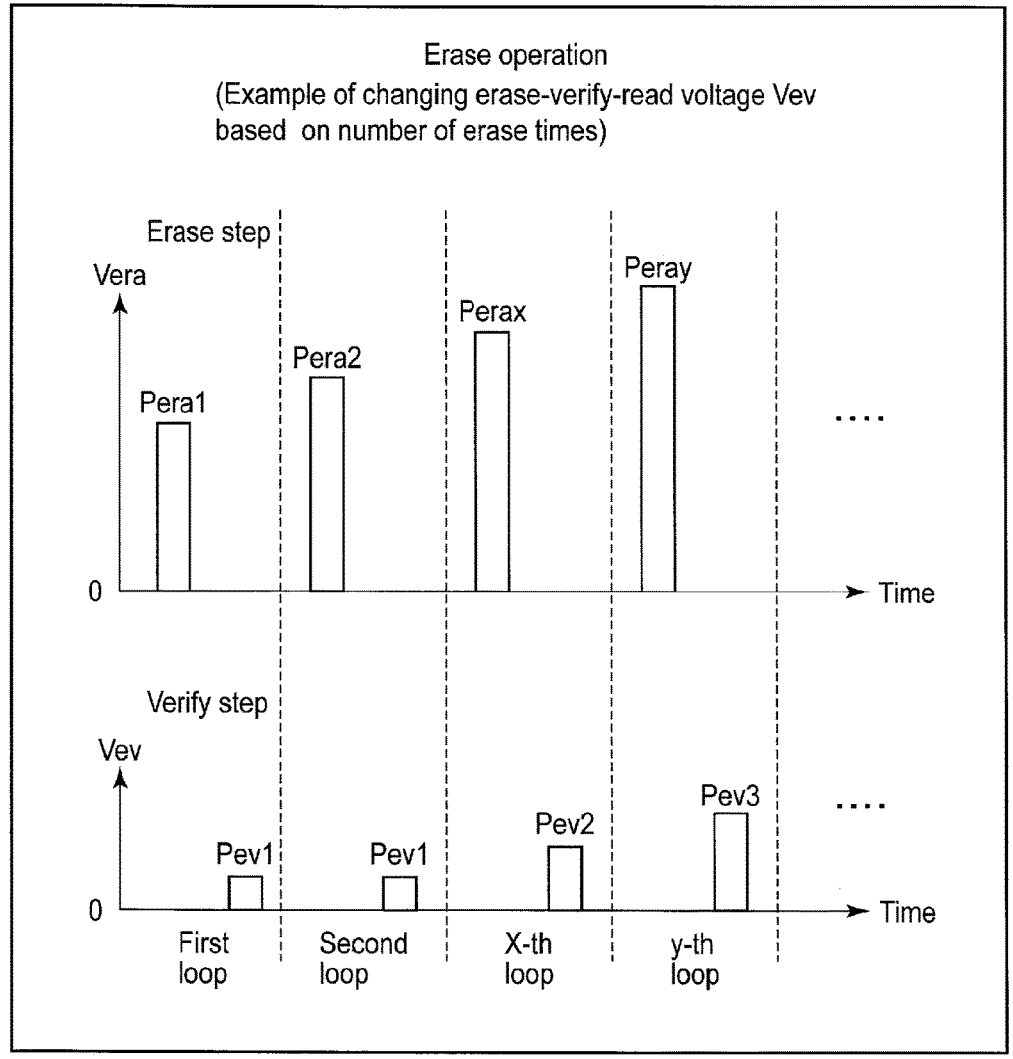
F I G. 10

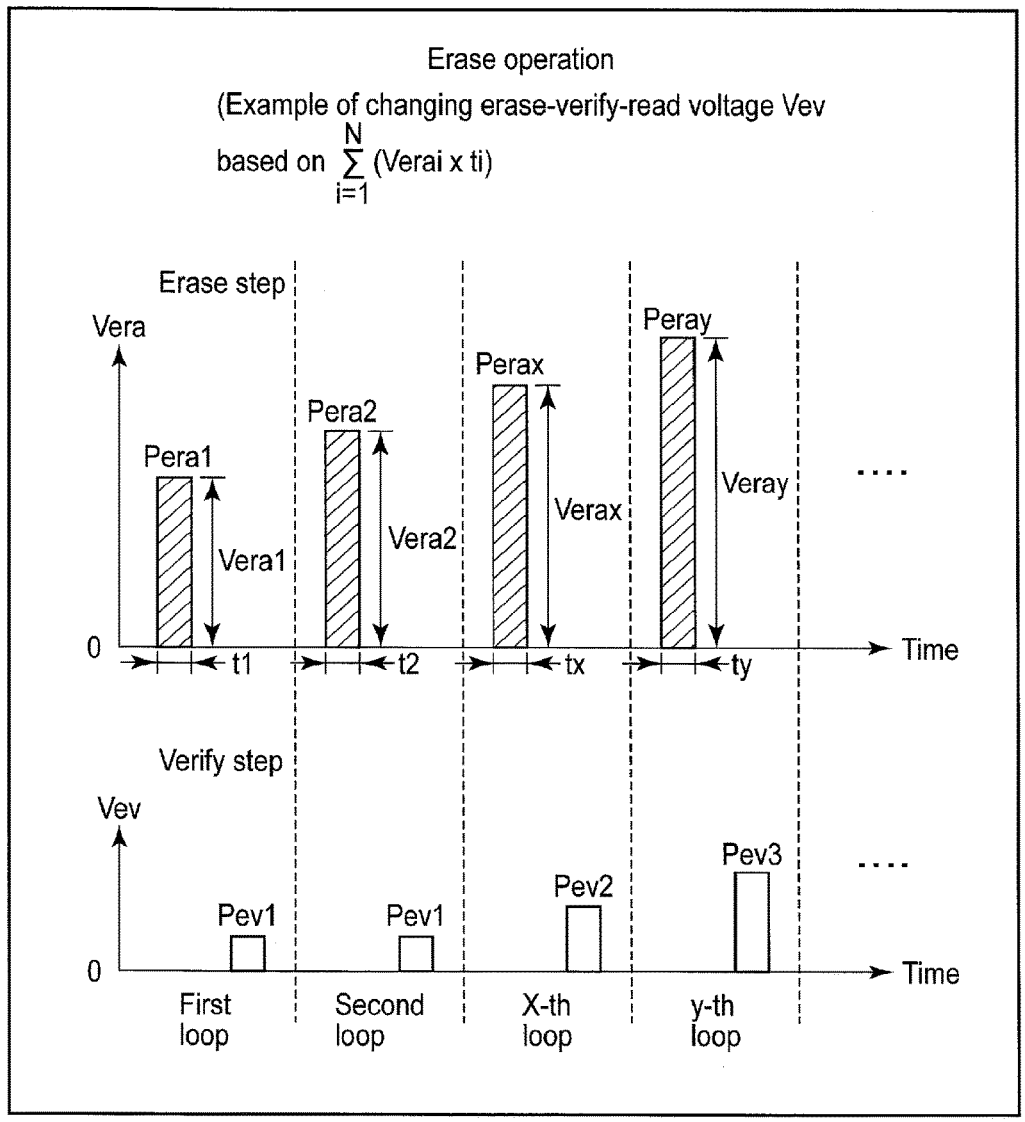
F I G. 11

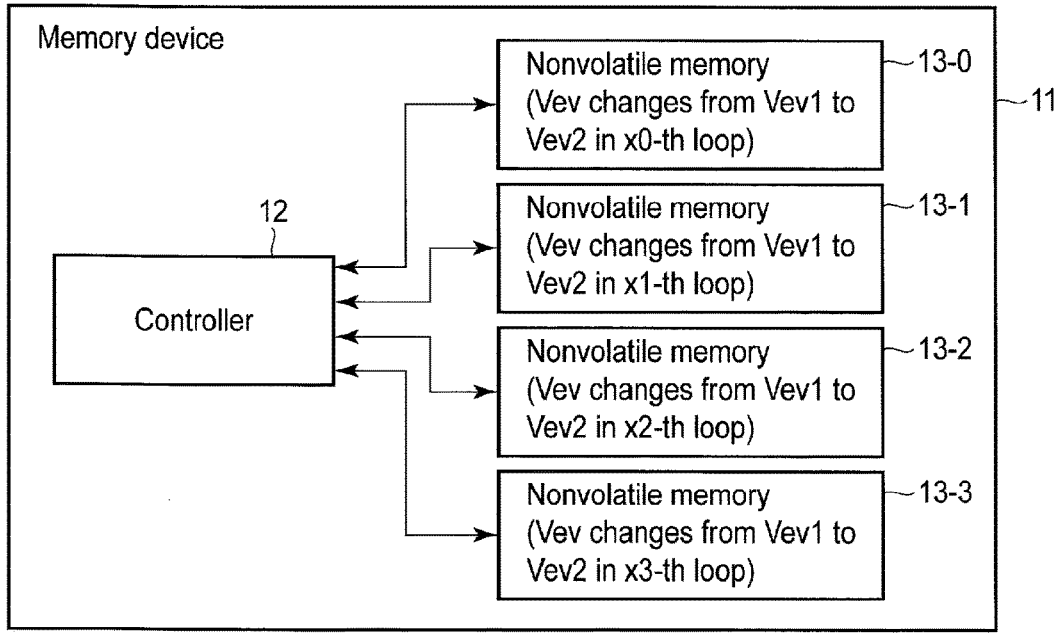
F I G. 13
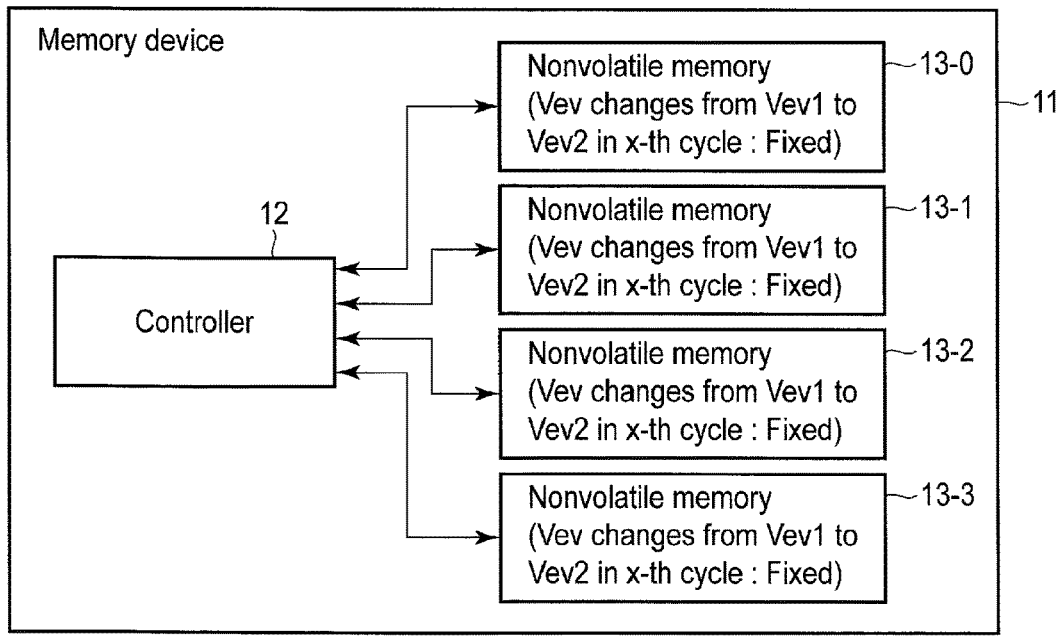
F I G. 14

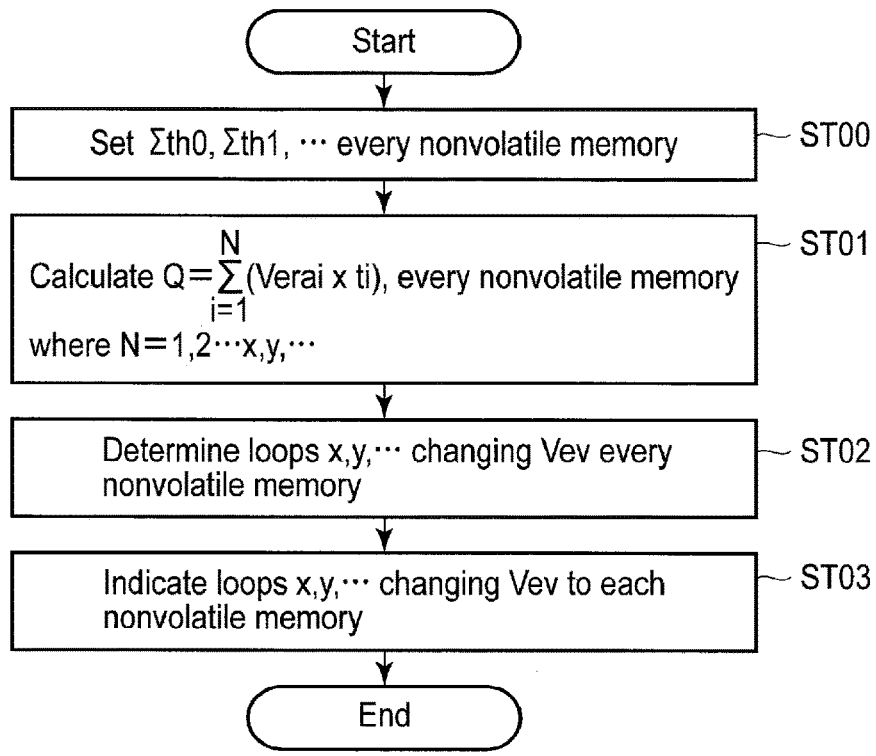
F I G. 15
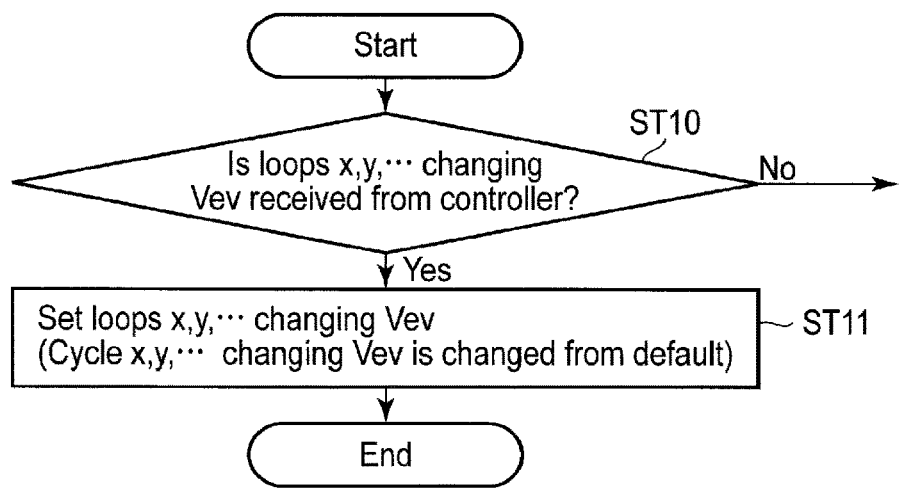
F I G. 16

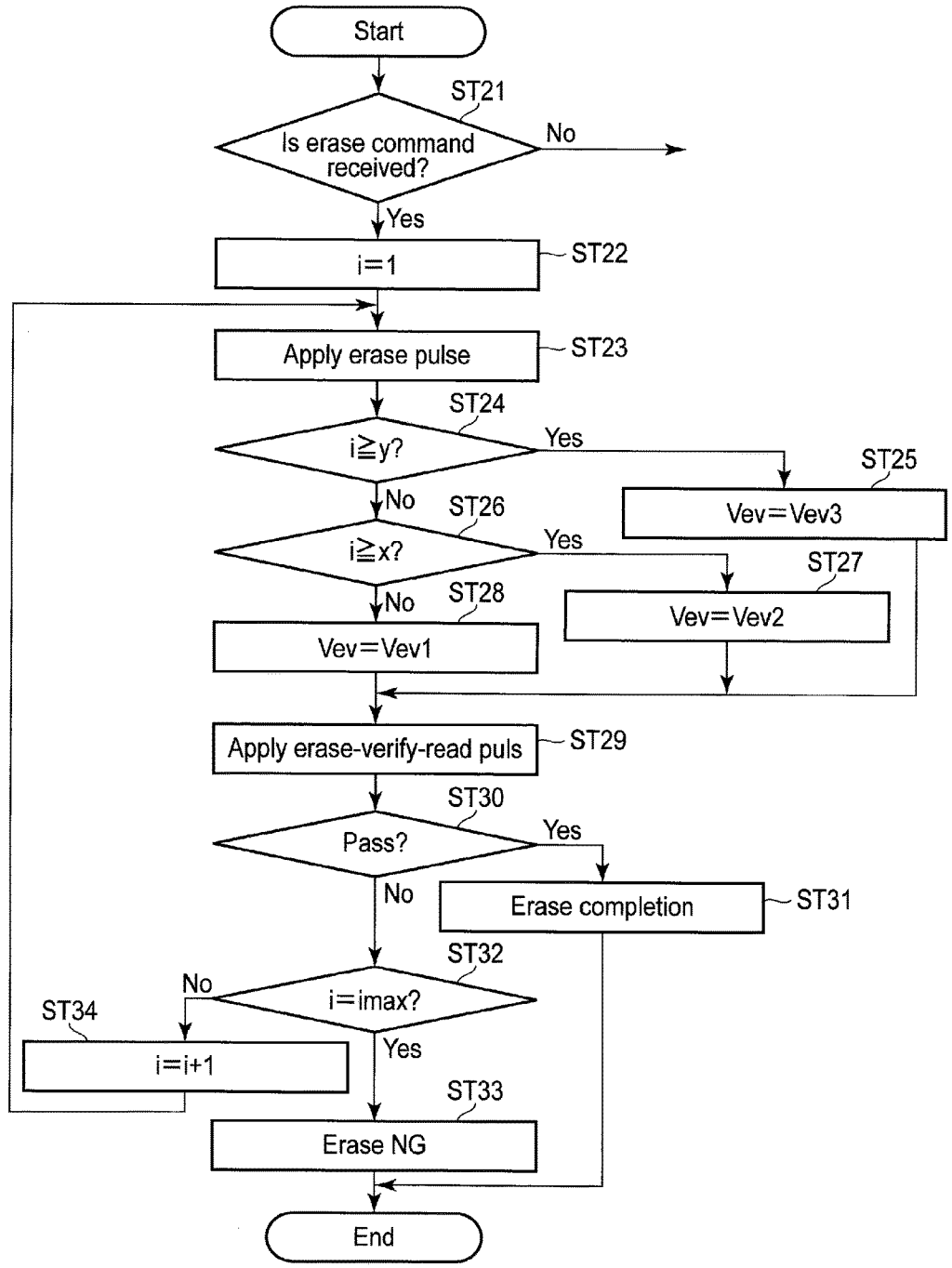
F I G. 17

MEMORY DEVICE

CROSS-REFERENCE TO RELATED APPLICATIONS

This application claims the benefit of U.S. Provisional Application No. 62/313,319, filed Mar. 25, 2016, the entire contents of which are incorporated herein by reference.

FIELD

Embodiments described herein relate generally to a memory device.

BACKGROUND

In a memory device comprising a controller and a nonvolatile memory controlled by the controller, an operation for erasing data stored in the nonvolatile memory is executed by the erase algorithm of a plurality of loops to reduce a voltage stress applied to a memory cell. Each loop includes an erase step for applying an erase pulse and a verify step for verifying the threshold voltage of the memory cell after the erase step. The erase pulse is increased in proportion to the loop count. The above erase algorithm is terminated in the loop in which erasing is completed.

BRIEF DESCRIPTION OF THE DRAWINGS

FIG. 5 is a view illustrating an exemplary distribution of thresholds of memory cells.
FIG. 6 is a view illustrating the relationship between the number of writes/erases and an erase error rate.
FIG. 7 is a view illustrating an exemplary algorithm of an erase operation.
FIG. 8 and FIG. 9 are views illustrating exemplary distributions of thresholds of memory cells.
FIG. 10 and FIG. 11 are views illustrating exemplary algorithms of an erase operation.
FIG. 13 and FIG. 14 are views illustrating exemplary memory systems.
FIG. 15 and FIG. 16 are flowcharts illustrating an exemplary operation for setting the loop count for changing the erase-verify-read voltage.
FIG. 17 is a flowchart illustrating an exemplary erase operation.

DETAILED DESCRIPTION

In general, according to one embodiment, a memory device comprises: a controller; and a nonvolatile memory controlled by the controller, the nonvolatile memory executing an erase operation by an algorithm which repeats loops, each loop including an erase step applying an erase pulse to a memory cell and a verify step verifying a threshold voltage of the memory cell after the erase step, an erase-verify-read voltage using the verify step changing in a x-th loop (x is a natural number equal to or larger than 2). The controller is capable of changing a value of x, and indicates the value of x to the nonvolatile memory.

An embodiment will be described hereinafter with reference to the accompanying drawings.

Embodiment

Figures 1, 12:
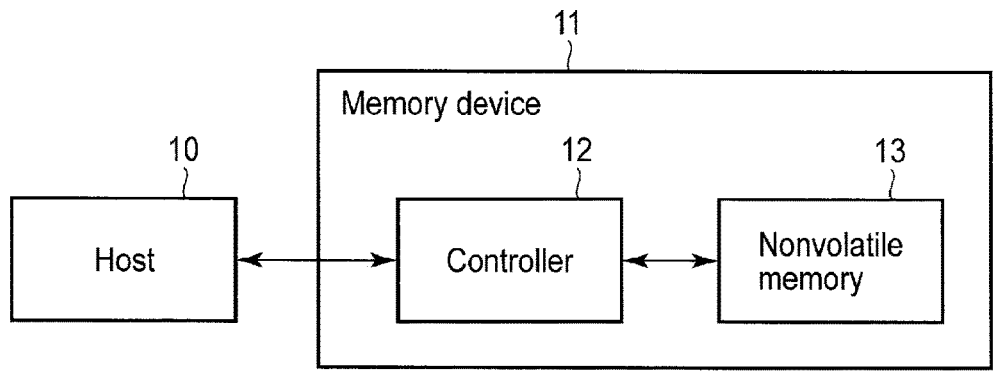
FIG. 1 is a view illustrating an exemplary memory system.
FIG. 12 is a view illustrating the relationship between the sum of voltage stresses and an erase-verify-read voltage.

FIG. 1 illustrates an exemplary memory system.

A memory system to which the present embodiment may be applicable comprises a host 10 and a memory device 11. The host 10 may be an electronic device such as a personal computer or a mobile device (strictly, a processor in an electronic device, etc.). It is also possible that the host 10 may be an imaging device such as a digital still camera or a video camera. Alternatively, it is furthermore possible that the host 10 may be a tablet computer, a smart-phone, a game console, a car navigation system, a printer, a scanner, a server system, etc.

The memory device 11 is a storage device connectable to the host 10 such as a solid-state drive (SSD), an USB memory (a flash drive) or a memory card. The memory device 11 comprises a controller 12 and a nonvolatile memory 13 controlled by the controller 12.

The controller 12 controls, for example, the operation of reading data from the nonvolatile memory 13, writing data to the nonvolatile memory 13 or erasing data from the nonvolatile memory 13. The controller 12 is also located in the internal space between the host 10 and the nonvolatile memory 13. The nonvolatile memory 13 is, for example, a NAND memory. The NAND memory is a semiconductor memory in which data can be stored with non-volatility. When the nonvolatile memory 13 is a NAND memory, the NAND memory may comprise memory cells each having a two-dimensional structure or may comprise memory cells each having a three-dimensional structure.

The controller 12 is provided in, for example, a first chip. The nonvolatile memory 13 is provided in, for example, a second chip different from the first chip.

Figure 2:
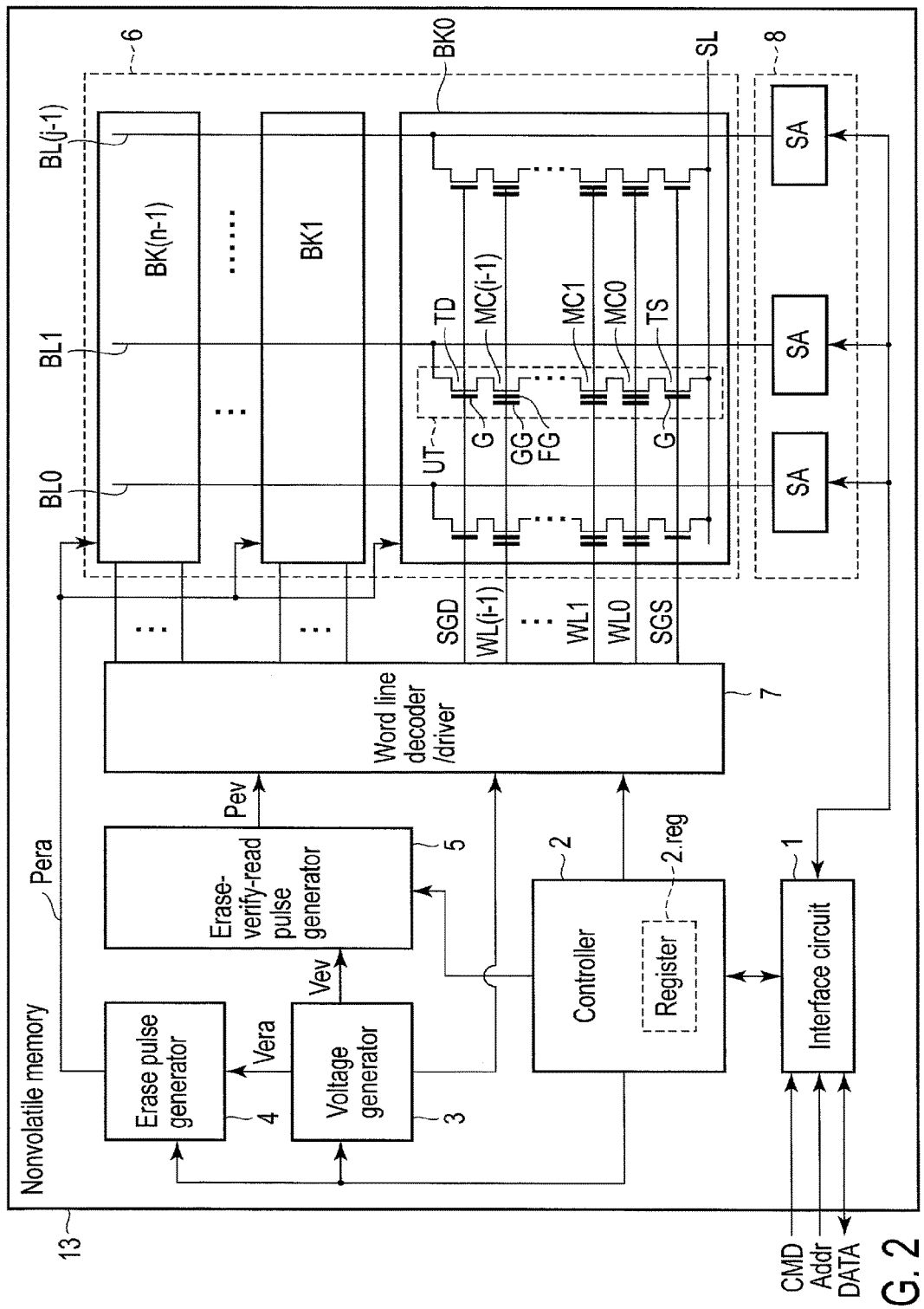
FIG. 2 is a view illustrating an exemplary nonvolatile memory.

FIG. 2 illustrates an exemplary nonvolatile memory.

The nonvolatile memory 13 is a NAND memory. The nonvolatile memory 13 comprises an interface circuit 1, a controller 2, a voltage generator 3, an erase pulse generator 4, an erase-verify-read pulse generator 5, a memory cell array 6, a word line decoder/driver 7 and a read/write circuit 8 including a sense amplifier SA.

The interface circuit 1 receives, for example, a read/write/erase command CMD and an address Addr from the controller 12 of FIG. 1. The interface circuit 1 functions as an interface of read/write data DATA.

The controller 2 controls a read/write/erase operation for the memory cell array 6. For example, when the interface circuit 1 receives an erase command, the controller 2 controls an erase operation for the memory cell array 6. In the erase operation, the controller 2 activates the voltage generator 3, the erase pulse generator 4 and the erase-verify-read pulse generator 5.

The erase pulse generator 4 generates an erase pulse Pera based on an erase voltage Vera from the voltage generator 3. The erase-verify-read pulse generator 5 generates an erase-verify-read pulse Pev based on an erase-verify-read voltage Vev from the voltage generator 3.

The controller 2 comprises, for example, a register 2_reg. The register 2_reg is used to register predetermined data in the algorithm of an erase operation as described later.

The memory cell array 6 comprises a plurality of blocks (n blocks in the present embodiment) BK0, BK1, . . . , BK(n−1). Each block comprises a plurality of cell units UT connected to a plurality of bit lines (j bit lines in the present embodiment) BL0, BL1, . . . , BL(j−1), respectively.

For example, in block BK0, each cell unit UT comprises a NAND string comprising a plurality of memory cells (i memory cells in the present embodiment) MC0, MC1, . . . , MC(i−1) connected in series, a select transistor TS connected between the NAND string and a source line SL, and a select transistor TD connected between the NAND string and a bit line BLk, where k is one of 1 to (j−1).

Each of memory cells MC0, MC1, . . . , MC(i−1) is, for example, a flash memory cell (a field-effect transistor [FET]) comprising a charge storage layer FG; Floating Gate and a control gate electrode CG. Each of select transistors TS and TD is, for example, a FET comprising a gate electrode G.

The control gate electrodes CG of memory cells MC0, MC1, . . . , MC(i−1) are connected to a plurality of word lines WL0, WL1, . . . , WL(i−1), respectively. The gate electrodes G of select transistors TS and TD are connected to select gate lines SGS and SGD, respectively. A plurality of bit lines BL0, BL1, . . . , BL(j−1) are connected to the interface circuit 1 via the sense amplifiers SA of the read/write circuit 8.

In the nonvolatile memory 13 having the above structure, an erase operation is executed for each block.

For example, a case where the data of memory cells MC0, MC1, . . . , MC(i−1) of block BK0 is selectively erased is assumed.

An erase operation comprises an erase step for applying an erase pulse and a verify step for verifying the threshold voltage of memory cells after the erase step.

In the erase step, the word line decoder/driver 7 sets word lines WL0, WL1, . . . , WL(i−1) and select gate lines SGS and SGD connected to block BK0 to a predetermined potential for an erase operation, and sets word lines WL0, WL1, . . . , WL(i−1) and select gate lines SGS and SGD connected to the other blocks BK1, . . . , BK(n−1) to a floating state. The erase pulse generator 4 selectively applies an erase pulse Pera to block BK0.

The selective application of an erase pulse Pera to block BK0 indicates that an erase pulse Pera is selectively applied to a back gate (for example, a well region) BG provided in common with the cell units UT of block BK0. It should be noted that the back gate BG is provided independently in each block.

Figure 3:
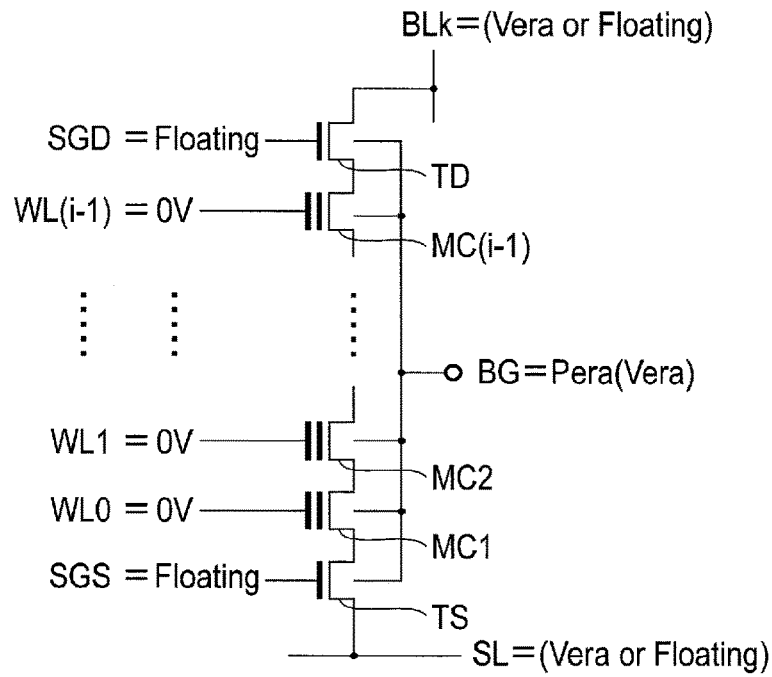
FIG. 3 is a view illustrating an exemplary relationship of voltage in an erase step.

When an erase pulse Pera is selectively applied to block BK0, the relationship of voltage of each cell unit UT is, for example, shown in FIG. 3. Word lines WL0, WL1, . . . , WL(i−1) are set to 0 V. Select gate lines SGS and SGD are set to a floating state. The source line SL and bit line BLk are set to an erase voltage Vera or a floating state, where k is one of 1 to (j−1). In this state, an erase pulse Pera(Vera) is applied to the back gate BG.

In the verify step, the word line decoder/driver 7 sets word lines WL0, WL1, . . . , WL(i−1) and select gate lines SGS and SGD connected to block BK0 to a predetermined potential for an erase-verify operation, and sets word lines WL0, WL1, . . . , WL(i−1) and select gate lines SGS and SGD connected to the other blocks BK1, . . . , BK(n−1) to a floating state. The erase-verify-read pulse generator 5 transfers an erase-verify-read pulse Pev to the word line decoder/driver 7.

Figure 4:
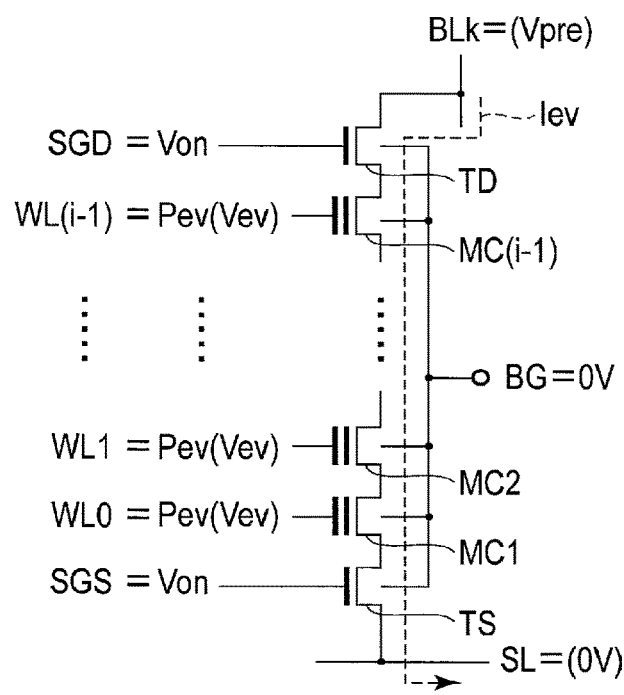
FIG. 4 is a view illustrating an exemplary relationship of voltage in a verify step.

When an erase-verify-read pulse Pev is selectively applied to block BK0, the relationship of voltage of each cell unit UT is, for example, shown in FIG. 4. The back gate BG is set to 0 V. Select gate lines SGS and SGD are set to an on-voltage Von which changes them to an on-state. Bit line BLk is set to a predetermined voltage Vpre, where k is one of 1 to (j−1). The source line SL is set to 0 V. In this state, an erase-verify-read pulse Pev(Vev) is applied to word lines WL0, WL1, . . . , WL(i−1).

In FIG. 4, when the data of all of memory cells MC0, MC1, . . . , MC(i−1) is erased, all of memory cells MC0, MC1, . . . , MC(i−1) are in an on-state in the verify step. Thus, an erase verify current Iev is supplied to memory cells MC0, MC1, . . . , MC(i−1). The voltage of bit line BLk is decreased from the predetermined voltage Vpre.

When the data of at least one of memory cells MC0, MC1, . . . , MC(i−1) is not erased, none of memory cells MC0, MC1, . . . , MC(i−1) is an on-state in the verify step. Thus, an erase verify current Iev is not supplied to memory cells MC0, MC1, . . . , MC(i−1), and bit line BLk maintains the predetermined voltage Vpre.

The controller 2 is allowed to verify whether erasing is completed in the verify step by sensing the voltage of bit line BLk with the sense amplifiers SA of the read/write circuit 8.

FIG. 5 illustrates the distribution of thresholds of memory cells in a write state and an erase state.

In the figure, the horizontal axis represents the threshold voltage, and the vertical axis represents the number of memory cells.

Here, to simplify the explanation, each memory cell is assumed to be a two-level cell, specifically, a write state (W) and an erase state (E). In a multilevel cell such as a three-level or greater cell, one distribution of thresholds in a write state (W) may be changed to a plurality of distributions of thresholds.

The distribution of thresholds of memory cells in a write state (W) is present in, for example, an area in which the voltage is greater than a write-verify-read current Vwv. The write-verify-read voltage Vwv is used in a verify step for verifying whether writing is completed in a write operation.

The distribution of thresholds of memory cells in an erase state (E) is present in, for example, an area in which the voltage is less than an erase-verify-read voltage Vev. The erase-verify-read voltage Vev is used in a verify step for verifying whether erasing is completed in an erase operation as described above.

A read voltage Vr is set between the write-verify-read voltage Vwv and the erase-verify-read voltage Vev. In a normal read operation, a read step is executed using the read voltage Vr. In this manner, the data of memory cells can be read.

When a write operation and an erase operation are executed repeatedly, in other words, when the sum of voltage stresses applied to memory cells is increased, the wear of memory cells is developed.

For example, a write/erase operation is executed by transferring charge (for example, electrons) between the back gate BG of memory cells and a charge storage layer via a tunnel insulating layer. Thus, when the number of writes/erases is increased, the tunnel insulating layer is degraded. In some memory cells, the charge trapped in the tunnel insulating layer is increased, or charge leaks easily from the charge storage layer.

The distribution of thresholds of memory cells in an erase state (E) changes from a precipitous distribution (solid line) to a distribution with a broad base (dashed line).

The distribution with a broad base produces a memory cell in an over-erase sate and increases the erase error rate. Such a distribution is not desirable. An over-erase state indicates a state in which the threshold voltage of the memory cell is less than necessary. The erase error rate indicates the proportion of memory cells in which erasing is not completed even after an erase operation to the memory cells of the target block for an erase operation.

For example, a memory cell in an over-erase state has an influence on the threshold voltage of a predetermined memory cell adjacent to the memory cell in an over-erase state. Even when data is to be written to the predetermined memory cell to change it to a write state (W), the threshold voltage of the predetermined memory cell may not be made greater than a write-verify-read voltage Vwv because of the effect of the memory cell in an over-erase state. Thus, a write error may be generated.

In an erase operation, for example, as shown in FIG. 6, the permissible value Rth for erase error rate is set. When the erase error rate is less than or equal to the permissible value Rth after executing an erase operation for a predetermined block, it is determined that the erase operation of the predetermined block is completed. When the erase error rate is greater than the permissible value Rth after executing an erase operation for a predetermined block, it is determined that the predetermined block is a bad block having an erase defect.

The number of writes/erases Na at which the permissible value Rth is reached (conventional example) is preferably as great as possible. However, the distribution with a broad base (dashed line) in FIG. 5 facilitates an increase in the erase error rate (the A portion in FIG. 5). Thus, in the conventional example, the number of writes/erases Na at which the permissible value Rth is reached cannot be sufficiently great.

To prevent the generation of the distribution with a broad base, the sum of voltage stresses applied to memory cells in a write/erase operation should be as less as possible. When the sum of voltage stresses applied to memory cells is less, the charge trapped in the tunnel insulating layer is decreased. Further, charge is difficult to leak from the charge storage layer (in other words, the characteristics of data retention are improved). Thus, the distribution of thresholds of memory cells in an erase state (E) in FIG. 5 can maintain a long precipitous state (solid line).

In this case, for example, as shown in FIG. 6, the number of writes/erases Nb at which the erase error rate reaches the permissible value Rth (in the embodiment) is greater than that (Na) of the conventional example. This means that the endurance characteristics of the nonvolatile memory are improved, in other words, the life duration of each block of the nonvolatile memory (the time span in which each block can be used as a valid block) is extended.

Now, this specification explains a technique for decreasing the sum of voltage stresses applied to memory cells in a write/erase operation as far as possible.

FIG. 7 illustrates an example in which an erase operation is executed by the erase algorithm of a plurality of loops (in other words, by the erase loop algorithm of a plurality of iterations).

An erase operation comprises, for example, z loops (iterations), where z is a natural number greater than or equal to 2. Each loop comprises an erase step for applying an erase pulse and a verify step for verifying the threshold voltage of the memory cell after the erase step. The erase pulse is increased in proportion to the loop count. The above erase algorithm is terminated in the loop in which erasing is completed.

For example, in the first loop (in other words, in the first iteration of the loop), the erase step is executed using the erase pulse Pera of voltage Vera 1, and the verify step is executed using erase-verify-read pulse Pev1 of voltage Vev1. In a similar manner, in the second, . . . , $x^{th}$, . . . , $y^{th}$, . . . loops, the erase step is executed using erase pulses Pera2, . . . , Perax, . . . , Peray, . . . of voltages Vera2, . . . , Verax, . . . , Veray, . . . , respectively, and the verify step is executed using erase-verify-read pulse Pev1 of voltage Vev1.

Here, Vera1<Vera2< . . . Verax< . . . <Veray . . . . In general, to simplify the voltage generator, the following relationships are preferably satisfied: Veraq=Vera_ini+(q−1)×α; q=1, 2, . . . , x, . . . , y, . . . , z; and α is a constant value. Vera_ini is the default value of erase voltage.

In this case, for example, as shown in FIG. 8, the distribution of thresholds in a write state (W) gradually moves to an erase completion state as the loop count is increased. The loop count at which erasing is completed is optimized for each block based on the degree of wear of memory cells. For example, when erasing is completed in the $x^{th}$ loop of the erase operation of one block, it is unnecessary to execute the subsequent loops for the block.

Thus, it is possible to reduce the voltage stress applied to memory cells and prevent the generation of a memory cell in an over-erase state in an erase operation which employs the above algorithm in comparison with, for example, a case where erasing is completed by applying an erase pulse having a great voltage only once.

In the example of FIG. 7, the voltage stress applied to memory cells can be reduced. However, when the number of writes/erases is increased, the distribution of thresholds of memory cells in an erase state (E) still gets closer to the state having a broad base (dashed line) in FIG. 5. In this case, if the algorithm of FIG. 7 is simply employed, a memory cell in an over-erase state is generated as shown in the distribution of thresholds (dashed line BRx) of FIG. 9.

FIG. 10 illustrates an example in which the erase-verify-read voltage is changed further in the algorithm of FIG. 7.

When a memory cell in an over-erase state is generated as shown in the distribution of thresholds (dashed line BRx) of FIG. 9, this situation can be eliminated in the following manner. The threshold (erase-verify-read voltage Vev) which passes verification of whether erasing is completed should be alleviated when a predetermined condition is satisfied in the verify step after the erase step.

For example, as shown in FIG. 9, the threshold which passes verification of whether erasing is completed may be alleviated by shifting the erase-verify-read voltage Vev to the read voltage Vr side or the write-verify-read voltage Vwv side, in other words, by increasing the erase-verify-read voltage Vev from Vev1 to Vev2, when a predetermined condition is satisfied. Here, Vev2=Vev1+γ, and Vev2<Vr<Vwv.

In this manner, it is possible to prevent the generation of a memory cell in an over-erase state as shown in the distribution of thresholds (dashed line BRy) of FIG. 9 even in a nonvolatile memory in which the distribution of thresholds of memory cells in an erase state (E) has a broad base (dashed line BRx) in FIG. 9 because of an increase in the number of writes/erases.

In the example of FIG. 10, the predetermined condition for alleviating the threshold which passes the above verification is determined based on, for example, the loop count of the erase operation. In this case, the loops may be counted by a loop counter. Therefore, for example, the algorithm of FIG. 10 can be controlled by the controller 2 of FIG. 2. Alternatively, the algorithm of FIG. 10 may be controlled by the controller 12 of FIG. 1.

Now, this specification explains an example in which the threshold which passes the above verification is alleviated in each of the $x^{th}$ and $y^{th}$ loops. Here, x is 2 or a natural number greater than 2. Further, y is 3 or a natural number greater than 3. In addition, x<y.

In the first loop, the erase step is executed using the erase pulse Pera of voltage Vera1, and the verify step is executed using erase-verify-read pulse Pev1 of voltage Vev1. In a similar manner, in the second, . . . , $x^{th}$, . . . , $y^{th}$, . . . loops, the erase step is executed using erase pulses Pera2, . . . , Perax, . . . , Peray, . . . of voltages Vera2, . . . , Verax, . . . , Veray, . . . , respectively.

Until the loop immediately before the $x^{th}$ loop, the verify step is executed using erase-verify-read pulse Pev1 of voltage Vev1 in a manner similar to that of the first loop. In the $x^{th}$ loop, the verify step is executed using erase-verify-read pulse Pev2 of voltage Vev2 greater than voltage Vev1. From the $x^{th}$ loop to the loop immediately before the $y^{th}$ loop, the verify step is executed using erase-verify-read pulse Pev2 of voltage Vev2.

In the $y^{th}$ loop, the verify step is executed using erase-verify-read pulse Pev3 of voltage Vev3 greater than voltage Vev2. From the $y^{th}$ loop to the $z^{th}$ loop which is the last loop, the verify step is executed using erase-verify-read pulse Pev3 of voltage Vev3.

When the algorithm which changes the erase-verify-read voltage based on the loop count of erase operation is employed, it is possible to prevent the generation of a memory cell in an over-erase state as shown in the distribution of thresholds (dashed line BRy) of FIG. 9 even in a nonvolatile memory in which the distribution of thresholds of memory cells in an erase state (E) has a broad base (dashed line) in FIG. 5 because of an increase in the number of writes/erases.

It should be noted that, in the algorithm of FIG. 10, the threshold which passes the verification of whether erasing is completed (the erase-verify-read voltage Vev) is changed based on the loop count of erase operation. In general, the loop count for changing the threshold is fixed in the nonvolatile memory (in the above example, the x-loop and the y-loop) since the algorithm of FIG. 10 is controlled in the nonvolatile memory, in other words, controlled by the controller 2 of FIG. 2, as described above.

In this case, the loop count for changing the threshold is stored in, for example, a ROM in the nonvolatile memory such as a fuse. The current loop count (the value of the loop counter) is compared to the loop count stored in the ROM.

Recently, properties have varied widely among memory cells of nonvolatile memories in the wafer process (manufacturing stage) as the memory cells have been reduced in size and manufactured to have a three-dimensional structure. The properties include a feature of whether the charge is trapped easily in the tunnel insulating layer, a feature of whether the charge in the charge storage layer leaks easily (data retention characteristics), etc.

Thus, properties vary easily among a plurality of chips extracted from one wafer. This means that the properties of the memory cells of the nonvolatile memory of FIG. 2 are not necessarily constant.

In this case, when the loop count for changing the threshold which passes the verification of whether erasing is completed is fixed as shown in the algorithm of FIG. 10, the loop count for changing the above threshold cannot be set such that the loop count is very suitable for the degree of wear of memory cells.

In the example of FIG. 10, the loop count for changing the threshold which passes the verification of whether erasing is completed is fixed at the x-loop and the y-loop. However, for example, in one nonvolatile memory, the loop count for changing the above threshold may be preferably set to a loop before the x-loop and a loop before the y-loop. In a similar manner, in another nonvolatile memory, the loop count for changing the above threshold may be preferably set to a loop after the x-loop and a loop after the y-loop.

In consideration of the variation in the properties of nonvolatile memories, the loop count for changing the threshold which passes the verification of whether erasing is completed is preferably variable. To set the loop count for changing the above threshold to optimal values, the loop count is preferably determined such that the wear of memory cells is reflected sufficiently. The newly proposed algorithm contains the changing erase verify read voltage with increasing the stress in memory cells, which is described in FIG. 10

To solve the above problem, this specification suggests algorithm which further changes the erase-verify-read voltage based on the degree of wear of memory cells in the algorithm of FIG. 10 in a manner different from that of the algorithm of FIG. 7.

FIG. 11 illustrates an example in which the erase-verify-read voltage is changed based on the degree of wear of memory cells.

In this example, the loop count for changing the threshold which passes the above verification is variable. This loop count is determined based on the degree of wear of memory cells. The algorithm of FIG. 11 is controlled by, for example, the controller 12 (which is a controller outside the nonvolatile memory) of FIG. 1 in a manner different from that of the example of FIG. 10. The controller 12 of FIG. 1 provides the nonvolatile memory 13 of FIG. 1 with an instruction on the loop count for changing the threshold which passes the above verification based on the degree of wear of memory cells.

For example, the degree of wear of memory cells is determined by the controller 12 of FIG. 1 based on $\Sigma^{N}_{i=1}$ (Verai×ti). Verai is the voltage of erase pulse Perai in the $i^{th}$ loop, and ti is the pulse width of erase pulse Pera in the $i^{th}$ loop. $\Sigma^{N}_{i=1}$(Verai×ti) shows the sum of voltage stresses until the Nth loop.

The controller 12 of FIG. 1 is allowed to presume that an effect to be caused by a memory cell in an over-erase state cannot be ignored, in other words, the erase-verify-read voltage should be changed, when the sum Q of voltage stresses applied to memory cells in one erase operation exceeds predetermined values Σth0 and Σth1, based on the characteristics of the nonvolatile memory 13 of FIG. 1 as shown in, for example, FIG. 12.

Thus, the controller 12 of FIG. 1 is allowed to obtain the value of N for each nonvolatile memory when Q=$\Sigma^{N}_{i=1}$ (Verai×ti) exceeds predetermined values Σth0 and Σth1. The controller 12 of FIG. 1 is allowed to change the erase-verify-read voltage Vev to an optimal value (Vev1-Vev2, Vev2-Vev3) in the N-loop.

In the example of FIG. 12, when the default value of the erase-verify-read voltage Vev is Vev1 (=Vini), and further when the sum Q of voltage stresses applied to memory cells in one erase operation exceeds predetermined value Σth0, the erase-verify-read voltage Vev is changed from Vev1 to Vev2. When the sum Q of voltage stresses applied to memory cells in one erase operation exceeds predetermined value Σth1, the erase-verify-read voltage Vev is changed from Vev2 to Vev3.

Here, Vev1<Vev2<Vev3, and for example, Vev2=Vev1×γ, and Vev3=Vev1×2γ, γ being a constant value or being various value each other. Predetermined values Σth0 and Σth1 differ depending on the nonvolatile memory.

In this case, the controller 12 of FIG. 1 executes control using Vev1 as the erase-verify-read voltage Vev from the first loop to the x-1$^{th}$ loop (1≤N≤x-1) when the sum $Q=\Sigma_{i=1}^{x}$ (Verai×ti) of voltage stresses from the first loop to the x$^{th}$ loop exceeds predetermined value Σth0. The controller 12 of FIG. 1 executes control for changing the erase-verify-read voltage Vev from Vev1 to Vev2 in the x$^{th}$ loop (N=x).

The controller 12 of FIG. 1 executes control using Vev2 as the erase-verify-read voltage Vev from the x$^{th}$ loop to the y-1$^{th}$ loop (x≤N≤y-1) when the sum $Q=\Sigma_{i=1}^{y}$(Verai×ti) of voltage stresses from the first loop to the y$^{th}$ loop exceeds predetermined value Σth1. The controller 12 of FIG. 1 executes control for changing the erase-verify-read voltage Vev from Vev2 to Vev3 in the y$^{th}$ loop (N=y).

Moreover, the controller 12 of FIG. 1 executes control using Vev3 as the erase-verify-read voltage Vev from the y$^{th}$ loop to the z$^{th}$ loop which is the last loop (y≤N≤z).

For example, the nonvolatile memory 13 comprises the register 2_reg in the controller 2 as shown in FIG. 2 to change the erase-verify-read voltage Vev in the x$^{th}$ and y$^{th}$ loops. The register 2_reg of FIG. 2 registers the value of x and the value of y specified by the controller 12 of FIG. 1.

As stated above, with the algorithm of FIG. 11, for example, the controller 12 of FIG. 1 is allowed to determine the loop count for changing the threshold which passes the verification of whether erasing is completed (the erase verify voltage Vev) for each nonvolatile memory based on the wear of memory cells, specifically, based on the sum $Q=\Sigma_{i=1}^{N}$ (Verai×ti) of voltage stresses applied to memory cells in one erase operation.

In this manner, even when the property varies depending on the nonvolatile memory, it is possible to set the loop count for changing the threshold which passes the above verification to an optimal value such that the loop count is suitable for the variation. In one nonvolatile memory, the algorithm of FIG. 11 is employed for each block which is the erase unit. Thus, the loop count in one erase operation is set to an optimal value based on the degree of wear of each block (in other words, the number of writes/erases).

FIG. 13 illustrates an application example of the memory device.

The memory device 11 is a memory device which employs the algorithm of FIG. 11.

The memory device 11 comprises, for example, the controller 12, and a plurality of nonvolatile memories (four nonvolatile memories in this example) 13_0, 13_1, 13_2 and 13_3 controlled by the controller 12. In this case, the controller 12 is allowed to set the loop count for changing the threshold which passes the verification of whether erasing is completed such that the loop count differs depending on the nonvolatile memory.

For example, in the erase operation of nonvolatile memory 13_0, the controller 12 executes control using Vev1 as the erase-verify-read voltage Vev in the loops before the X0$^{th}$ loop and executes control using Vev2 as the erase-verify-read voltage Vev in the x0$^{th}$ loop and the loops after the x0$^{th}$ loop when the loop count N in one erase operation reaches the x0$^{th}$ loop.

In the erase operation of nonvolatile memory 13_1, the controller 12 executes control using Vev1 as the erase-verify-read voltage Vev in the loops before the x1$^{th}$ loop and executes control using Vev2 as the erase-verify-read voltage Vev in the x1$^{th}$ loop and the loops after the x1$^{th}$ loop when the loop count N in one erase operation reaches the x1$^{th}$ loop.

In the erase operation of nonvolatile memory 13_2, the controller 12 executes control using Vev1 as the erase-verify-read voltage Vev in the loops before the x2$^{th}$ loop and executes control using Vev2 as the erase-verify-read voltage Vev in the x2$^{th}$ loop and the loops after the x2$^{th}$ loop when the loop count N in one erase operation reaches the x2$^{th}$ loop.

In the erase operation of nonvolatile memory 13_3, the controller 12 executes control using Vev1 as the erase-verify-read voltage Vev in the loops before the x3$^{th}$ loop and executes control using Vev2 as the erase-verify-read voltage Vev in the x3$^{th}$ loop and the loops after the x3$^{th}$ loop when the loop count N in one erase operation reaches the x3$^{th}$ loop.

It should be noted that each of x0, x1, x2 and x3 is a value which is set independently for the corresponding nonvolatile memory. In other words, x0, x1, x2 and x3 may differ from each other. Alternatively, some of them may be the same as each other.

FIG. 14 illustrates a comparative example of the memory device.

The memory device 11 is a memory device which employs the algorithm of FIG. 10.

In a manner similar to that of the application example of FIG. 13, the memory device 11 comprises the controller 12, and a plurality of nonvolatile memories (four nonvolatile memories in this example) 13_0, 13_1, 13_2 and 13_3 controlled by the controller 12. In nonvolatile memories 13_0, 13_1, 13_2 and 13_3, the loop count for changing the threshold which passes the verification of whether erasing is completed is the same.

For example, in the erase operation of each of nonvolatile memories 13_0, 13_1, 13_2 and 13_3, Vev1 is used as the erase-verify-read voltage Vev in the loops before the x$^{th}$ loop, and Vev2 is used as the erase-verify-read voltage Vev in the x$^{th}$ loop and the loops after the x$^{th}$ loop when the loop count N in one erase operation reaches the x$^{th}$ loop.

FIG. 15 and FIG. 16 illustrate flows for setting the loop count for changing the threshold which passes the verification of whether erasing is completed.

The flow of FIG. 15 is executed by, for example, the controller 12 of FIG. 1. The flow of FIG. 16 is executed by, for example, the controller 2 of FIG. 2.

In the controller 12 of FIG. 1, predetermined values Σth0, Σth1, . . . , are set for each nonvolatile memory (step ST00). Predetermined values Σth0, Σth1, . . . , may be reported by the host or may be reported by the nonvolatile memory. In the former case, predetermined values Σth0, Σth1, . . . , may be set by the user.

Subsequently, the controller 12 of FIG. 1 calculates $Q=\Sigma_{i=1}^{N}$ (Verai×ti) for each nonvolatile memory, where N=1, 2, . . . , x, . . . , y, . . . (step ST01). Verai and ti may be reported by the host or may be reported by the nonvolatile memory. In the former case, Verai and ti may be set by the user.

Subsequently, the controller 12 of FIG. 1 determines the loops (x$^{th}$ loop, y$^{th}$ loop, . . . ) for changing the erase-verify-read voltage Vev for each nonvolatile memory based on Σth0, Σth1, . . . , and Q ($=\Sigma_{i=1}^{N}$ (Verai×ti)) (step ST02).

Lastly, the controller 12 of FIG. 1 indicates the loops (x$^{th}$ loop, y$^{th}$ loop, . . . ) for changing the erase verify voltage Vev to each nonvolatile memory (step ST03).

After receiving the loops (x$^{th}$ loop, y$^{th}$ loop, . . . ) for changing the erase verify voltage Vev from the controller 12 of FIG. 1, the nonvolatile memory 13 of FIG. 1, in other words, the controller 2 of FIG. 2, sets the loops in, for example, the register 2_reg of FIG. 2 (steps ST10 and ST11).

For example, the nonvolatile memory 13 of FIG. 1 comprises the default of loops (X(default)th loop, Y(default) th loop, . . . ) for changing the erase verify voltage Vev.

After receiving the loops ($x^{th}$ loop, $y^{th}$ loop, . . . ) for changing the erase verify voltage Vev from the controller 12 of FIG. 1, the controller 2 of FIG. 2 changes the loops for changing the erase verify voltage Vev from the default (X(default)th loop, Y(default)th loop, . . . ) to the values ($x^{th}$ loop, $y^{th}$ loop, . . . ) specified by the controller 12 of FIG. 1.

The controller 2 of FIG. 2 maintains the default of loops (X(default)th loop, Y(default)th loop, . . . ) for changing the erase verify voltage Vev when the loops ($x^{th}$ loop, $y^{th}$ loop, . . . ) for changing the erase verify voltage Vev are not specified by the controller 12 of FIG. 12.

Subsequently, the erase operation is executed in accordance with the algorithm of FIG. 11.

FIG. 17 illustrates the flow of erase operation based on the algorithm of FIG. 11.

The flow of FIG. 17 is executed by, for example, the controller 2 of FIG. 2.

When the controller 2 of FIG. 2 confirms that an erase command is received, the controller 2 sets i to 1, and applies an erase pulse as the erase step of the first loop ($i^{th}$ loop) to the target block for erasing (steps ST21, ST22 and ST23).

Subsequently, the controller 2 of FIG. 2 selects Vev3 as the erase verify voltage Vev when i is greater than or equal to y. The controller 2 of FIG. 2 selects Vev2 as the erase verify voltage Vev when i is greater than or equal to x. The controller 2 of FIG. 2 selects Vev1 as the erase verify voltage Vev when i is less than x. Here, Vev1<Vev2<Vev3 (steps ST24, ST25, ST26, ST27 and ST28).

Subsequently, the controller 2 of FIG. 2 applies an erase-verify-read pulse as the verify step of the first loop ($i^{th}$ loop) to the target block for erasing. This erase-verify-read pulse has the erase verify voltage Vev selected in steps ST24 to ST28 (step ST29).

Subsequently, the controller 2 of FIG. 2 determines whether the data erasing of the target block for erasing is completed based on the data read from the target block for erasing by the verify step.

The controller 2 of FIG. 2 transmits a reply of erase completion to the controller 12 of FIG. 1 when the controller 2 determines that data erasing is completed (pass) (steps ST30 and ST31).

When the controller 2 of FIG. 2 determines that data erasing is not completed, the controller 2 confirms whether i (the number of loop times) reaches the maximum loop imax (for example, the z-loop). When i is imax, the controller 2 of FIG. 2 transmits a reply indicating that the data erasing of the target block for erasing has failed (NG), in other words, the target block is a bad block, to the controller 12 of FIG. 1 (steps ST32 and ST33).

When i is less than imax, the controller 2 of FIG. 2 sets i+1 as a new i (steps ST32 and ST34). The controller 2 of FIG. 2 applies the erase step and the verify step of the second loop (i+$1^{th}$ loop) to the target block for erasing in the above manner (steps ST23 to ST34).

These repetitive loops are executed until the data erasing of the target block for erasing reaches completion (step ST31) or fails (NG) (step ST34).

(Others)

When the controller 12 of FIG. 1 is capable of trimming the voltage and pulse width of an erase pulse, the voltage Verai and pulse width ti of the erase pulse in each loop differ depending on the nonvolatile memory. In this case, similarly, the controller 12 of FIG. 1 is allowed to accurately obtain the sum $\Sigma^{N}_{i=1}$(Verai×ti) of voltage stresses until the $N^{th}$ loop.

In the present embodiment, the control executed by the controller 12 of FIG. 1 may be applied by hardware, software or a combination thereof. Whether the algorithm of FIG. 10 should be realized by hardware, software or a combination thereof relies on the environment to which the memory system is applied, the restriction on the design of the memory system, etc.

For example, a person of ordinary skill in the art can realize the control executed by the controller 12 of FIG. 1, using various methods based on the specific embodiment. All of the modes realized in this way are included in the scope of the present invention.

CONCLUSION

As explained above, in the present embodiment, the loop count for changing the threshold (erase verify voltage) which passes the verification of whether erasing is completed is variable. In addition, the controller is allowed to determine the loop count for each nonvolatile memory based on the wear of memory cells. In this manner, even when the property varies depending on the nonvolatile memory, it is possible to set the loop count for changing the threshold which passes the above verification to an optimal value such that the loop count is suitable for the variation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a controller; and
a nonvolatile memory controlled by the controller, the nonvolatile memory executing an erase operation by an algorithm which repeats loops, each loop including an erase step applying an erase pulse to a memory cell and a verify step verifying a threshold voltage of the memory cell after the erase step, an erase-verify-read voltage being used in the verify step and being changed in an x-th loop (x is a natural number equal to or larger than 2) based on a number of loop times and a voltage value of the erase pulse which differs in at least two loops,
wherein the controller is capable of changing a value of x, and indicates the value of x to the nonvolatile memory.

2. The memory device of claim 1, wherein
the nonvolatile memory includes a register registering the value of x.

3. The memory device of claim 1, wherein
the controller indicates a value of N as the value of x when $\Sigma^{N}_{i=1}$(Verai×ti) exceeds a given value first, where Verai is the voltage value of the erase pulse in an i-th loop, and ti is a pulse width of the erase pulse in the i-th loop.

4. The memory device of claim 3, wherein
the given value is informed from a host being connectable to the memory device or the nonvolatile memory.

5. The memory device of claim 3, wherein
Verai and ti are informed from a host being connectable to the memory device or the nonvolatile memory.

6. The memory device of claim 1, wherein
the nonvolatile memory has a default of x, and
the value of x is changed from the default.

7. The memory device of claim 1, wherein
the erase-verify-read voltage is further changed in a y-th loop (y is a natural number equal to or larger than 3, and x<y), and
the controller is capable of changing a value of y, and indicates the value of y to the nonvolatile memory.

8. The memory device of claim 7, wherein
the erase-verify-read voltage is changed from Vev1 to Vev2 in the x-th loop, and is changed from Vev2 to Vev3 in the y-th loop, where Vev1<Vev2<Vev3.

9. The memory device of claim 8, wherein
Vev3=Vev1+2γ, and Vev2=Vev1+γ, where γ is any value which minimizes the cell stress.

10. The memory device of claim 1, wherein
the voltage value of the erase pulse is changed every loop.

11. The memory device of claim 10, wherein
Veraq=Vera_ini+(q−1)×α, where q is the number of loop times, Veraq is the voltage value of the erase pulse in a q-th loop, Vera_ini is an initial value of the voltage value of the erase pulse, and α is a steady value.

12. The memory device of claim 1, wherein
the nonvolatile memory includes blocks, and the algorithm is executed every block.

13. The memory device of claim 1, wherein
the controller is provided in a first chip, and the nonvolatile memory is provided in a second chip different from the first chip.

14. The memory device of claim 1, wherein
the nonvolatile memory is a NAND memory.

15. The memory device of claim 1, wherein
the memory device is a solid state drive (SSD).

16. A memory device comprising:
a controller; and
a nonvolatile memory controlled by the controller, the nonvolatile memory executing an erase operation by an algorithm which repeats loops, each loop including an erase step applying an erase pulse to a memory cell and a verify step verifying a threshold voltage of the memory cell after the erase step, an erase-verify-read voltage being used in the verify step and being changed in an x-th loop (x is a natural number equal to or larger than 2),
wherein the controller indicates a value of N as a value of x when $\Sigma^{N}_{i=1}$ (Verai×ti) exceeds a given value first, where Verai is a voltage value of the erase pulse in an i-th loop, and ti is a pulse width of the erase pulse in the i-th loop.

17. The memory device of claim 16, wherein
the nonvolatile memory includes a register registering the value of x.

18. The memory device of claim 16, wherein
the controller is capable of changing a value of x, and indicates the value of x to the nonvolatile memory.

19. The memory device of claim 16, wherein
the nonvolatile memory has a default of x, and
the value of x is changed from the default.

20. The memory device of claim 16, wherein
the nonvolatile memory includes blocks, and the algorithm is executed every block.

21. A memory device comprising:
a controller; and
a nonvolatile memory controlled by the controller, the nonvolatile memory executing an erase operation by an algorithm which repeats loops, each loop including an erase step applying an erase pulse to a memory cell and a verify step verifying a threshold voltage of the memory cell after the erase step, an erase-verify-read voltage being used in the verify step and being changed in an x-th loop (x is a natural number equal to or larger than 2) and in a y-th loop (y is a natural number equal to or larger than 3, and x<y),
wherein the erase-verify-read voltage is changed from Vev1 to Vev2 in the x-th loop, and is changed from Vev2 to Vev3 in the y-th loop, where Vev1<Vev2<Vev3, Vev3=Vev1+2γ, Vev2=Vev1+γ, and γ is any value which minimizes the cell stress.

\* \* \* \* \*